United States Patent
Shangguan et al.

(10) Patent No.: US 9,763,318 B2
(45) Date of Patent: Sep. 12, 2017

(54) CIRCUIT, DISPLAY SUBSTRATE AND DISPLAY DEVICE

(71) Applicant: BOE TECHNOLOGY GROUP CO., LTD., Beijing (CN)

(72) Inventors: Xingchen Shangguan, Beijing (CN); Pan Li, Beijing (CN); Jian Xu, Beijing (CN); Yongda Ma, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 99 days.

(21) Appl. No.: 14/908,815

(22) PCT Filed: Aug. 20, 2015

(86) PCT No.: PCT/CN2015/087643
§ 371 (c)(1),
(2) Date: Jan. 29, 2016

(87) PCT Pub. No.: WO2016/161743
PCT Pub. Date: Oct. 13, 2016

(65) Prior Publication Data
US 2017/0042022 A1    Feb. 9, 2017

(30) Foreign Application Priority Data
Apr. 7, 2015 (CN) ..................... 2015 2 0205678 U (51) Int. Cl.
*H05K 1/00* (2006.01)
*H05K 1/02* (2006.01)
(Continued)

(52) U.S. Cl.
CPC ....... *H05K 1/0242* (2013.01); *G02F 1/13306* (2013.01); *G09G 3/2096* (2013.01);
(Continued)

(58) Field of Classification Search
None
See application file for complete search history.

(56) References Cited

FOREIGN PATENT DOCUMENTS

| CN | 101645246 A | 2/2010 |
|----|-------------|--------|
| CN | 104145202 A | 11/2014 |

(Continued)

OTHER PUBLICATIONS

International Search Report dated Dec. 28, 2015 corresponding to International application No. PCT/CN2015/087643.

*Primary Examiner* — Jenny L Wagner
*Assistant Examiner* — India Davis
(74) *Attorney, Agent, or Firm* — Nath, Goldberg & Meyer; Joshua B. Goldberg (57) ABSTRACT

The present invention discloses a circuit, a display substrate and a display device, the circuit comprises a plurality of circuit modules, distances of at least one circuit module from two circuit modules adjacent thereto are a first distance and a second distance, respectively, the first distance is smaller than the second distance, and the absolute value of the difference between the second distance and the first distance is not equal to an integer multiple of the first distance. In the present invention, distances of at least one circuit module from two circuit modules adjacent thereto satisfy the above specific condition, so that at least one circuit module can be prevented from being positioned at the middle position of the standing wave field between the two circuit modules adjacent thereto, therefore, interference of standing wave to transmission signals is reduced, and signal distortion and signal attenuation are alleviated.

19 Claims, 4 Drawing Sheets

(51) Int. Cl.
  *G09G 3/36* (2006.01)
  *G02F 1/133* (2006.01)
  *G09G 3/20* (2006.01)
  *H05K 1/11* (2006.01)
  *H05K 1/14* (2006.01)

(52) U.S. Cl.
  CPC ............ *G09G 3/36* (2013.01); *H05K 1/0237* (2013.01); *G09G 3/20* (2013.01); *G09G 2300/0426* (2013.01); *G09G 2310/08* (2013.01); *G09G 2320/0223* (2013.01); *G09G 2320/0252* (2013.01); *G09G 2330/06* (2013.01); *G09G 2370/08* (2013.01); *H05K 1/117* (2013.01); *H05K 1/147* (2013.01); *H05K 2201/10128* (2013.01); *H05K 2201/10681* (2013.01)

(56) References Cited

FOREIGN PATENT DOCUMENTS

| | | |
|---|---|---|
| CN | 204496889 U | 7/2015 |
| WO | 2008105149 A1 | 9/2008 |

CIRCUIT, DISPLAY SUBSTRATE AND DISPLAY DEVICE

This is a National Phase Application filed under 35 U.S.C. 371 as a national stage of PCT/CN2015/087643, filed Aug. 20, 2015, an application claiming the benefit of Chinese Application No. 201520205678.3, filed Apr. 7, 2015, the content of each of which is hereby incorporated by reference in its entirety.

FIELD OF THE INVENTION

The present invention relates to the field of display technology, and particularly relates to a circuit, a display substrate and a display device.

BACKGROUND OF THE INVENTION

In the industry, a digital logic circuit is generally regarded as a high-speed circuit if the frequency of the circuit reaches or exceeds the range of 45 MHZ~50 MHZ, and circuits working within said range take up a certain percentage (e.g., ⅓) of the entire electronic system. Transmission and reflection of electromagnetic waves are basic phenomena in a high-speed circuit. Specifically, when propagating in a signal line, a signal will be strongly reflected in case of an obstacle. Unreasonable impedance matching may even cause the signal in a circuit to generate a standing wave. The standing wave leads to too strong or weak signal in a certain region, which makes it difficult to receive the signal, in the worst condition, severe signal distortion may occur, a receiver cannot even latch the signal, and signal distortion becomes severer with the increase in frequency of the signal.

In a liquid crystal display panel, a large amount of data needs to be transmitted from a timing controller to a source driver. Differential signal technique is generally adopted in the data transmission process, and a signal propagates in the form of electromagnetic wave in a differential signal line. With a further increase in resolution of liquid crystal display panel, a data transmission frequency is further increased. Currently, the data transmission frequencies in some high-resolution liquid crystal display devices have gone into microwave band (300 MHZ to 300 GHZ). However, the above characteristics of a high-frequency circuit restrict the design of a transmission signal line, as a signal inevitably passes a signal transmitter, a signal receiver and a terminal in the process of being transmitted from the timing controller to the source driver. Impedance mismatch may possibly occur at any one of the signal transmitter, the signal receiver and the terminal. If the impedance mismatch occurs, a standing wave may be generated and thus signal distortion and signal attenuation may occur.

SUMMARY OF THE INVENTION

To solve the above problem, the present invention provides a circuit, a display substrate and a display device, which are used to solve the problem of signal distortion and signal attenuation caused by standing wave interference in the prior art.

To this end, the present invention provides a circuit, which includes a plurality of circuit modules, for at least one of the circuit modules, distances of the circuit module from two circuit modules adjacent thereto are a first distance and a second distance, respectively, the first distance is smaller than the second distance, and the absolute value of the difference between the second distance and the first distance is not equal to an integer multiple of the first distance.

Optionally, a ratio of the absolute value of the difference between the first distance and the second distance to the sum of the first distance and the second distance is larger than a predetermined value.

Optionally, the predetermined value is 0.1048.

Optionally, the circuit modules are COFs, and the COFs are connected to a timing control circuit.

Optionally, the circuit modules are COGs, and the COGs are connected to a timing control circuit.

Optionally, the circuit further includes a first printed circuit board, on which a plurality of bonding areas respectively corresponding to the COFs are provided, a plurality of first gold fingers are provided in each bonding area, and each COF is connected to the first printed circuit board through the corresponding bonding area.

Optionally, a distance between any two adjacent COFs is the first distance or the second distance, and the first distance and the second distance alternate with each other.

Optionally, the circuit modules include COFs, a part of the COFs form a first COF set, the rest of the COFs form a second COF set, and the first COF set and the second COF set are connected to the timing control circuit, respectively.

Optionally, the circuit modules include COGs, a part of the COGs form a first COG set, the rest of the COGs form a second COG set, and the first COG set and the second COG set are connected to the timing control circuit, respectively.

Optionally, the circuit further includes a second printed circuit board, on which a plurality of bonding areas respectively corresponding to the COFs are provided, a plurality of first gold fingers are provided in each bonding area, and each COF is connected to the second printed circuit board through the corresponding bonding area.

Optionally, a distance between any two adjacent COFs is the first distance or the second distance, and the first distance and the second distance alternate with each other.

The first COF set includes a first COF and a third COF, the second COF set includes a second COF and a fourth COF, wherein, the first and second COFs are adjacent to each other, the third and first COFs are adjacent to each other, the fourth and second COFs are adjacent to each other, and a distance between the first COF and the third COF is the same or approximately the same as that between the second COF and the fourth COF.

Optionally, for at least one of the bonding areas, distances of the bonding area from two bonding areas adjacent thereto are a first bonding distance and a second bonding distance, respectively, the first bonding distance corresponds to the first distance, the second bonding distance corresponds to the second distance, the first bonding distance is K1 times as large as the first distance, and the second bonding distance is K2 times as large as the second distance, where both K1 and K2 are larger than 1.

Optionally, K1 ranges from 1.01 to 1.10, and K2 ranges from 1.01 to 1.10.

Optionally, K1 is equal to K2.

Optionally, both K1 and K2 equal to 1.05.

Optionally, a plurality of second gold fingers are provided between adjacent bonding areas, and the second gold fingers and the first gold fingers are formed simultaneously.

The present invention further provides a display substrate including any one of the above circuits.

The present invention further provides a display device comprising the above display substrate.

The present invention has the following beneficial advantages:

in a circuit, a display substrate and a display device provided by the present invention, distances of at least one circuit module from two circuit modules adjacent thereto satisfy the above specific condition, so that the at least one circuit module can be prevented from being positioned at the middle position of the standing wave field between the two circuit modules adjacent thereto, as a result, interference of standing wave to transmission signals is reduced, and signal distortion and signal attenuation are alleviated.

DETAILED DESCRIPTION OF THE EMBODIMENTS

To enable those skilled in the art to better understand the technical solutions of the present invention, the circuit, display substrate and display device provided by the present invention will be described in detail below in conjunction with the accompanying drawings.

Figure 1:
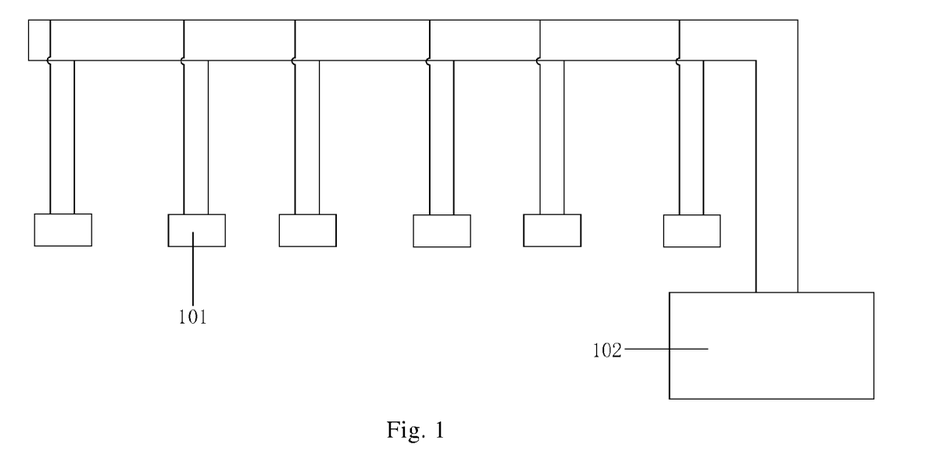
FIG. 1 is a schematic diagram of a structure of a circuit provided by a first embodiment of the present invention.

First Embodiment:

FIG. 1 is a schematic diagram of a structure of a circuit provided by a first embodiment of the present invention. As shown in FIG. 1, the circuit includes a plurality of circuit modules, which may be arranged in a line. For at least one of the circuit modules, distances of the circuit module from two circuit modules adjacent thereto are a first distance and a second distance, respectively. The first distance is smaller than the second distance, and the absolute value of the difference between the second distance and the first distance is not equal to an integer multiple of the first distance. That is, the first distance and the second distance satisfy a certain condition so that the at least one circuit module is prevented from being positioned at the middle position of the standing wave field between the two circuit modules adjacent thereto, i.e., the at least one circuit module is prevented from being positioned at an antinode of the standing wave, as a result, interference of the standing wave to transmission signals is reduced, and signal distortion and signal attenuation are alleviated.

Optionally, a ratio of the absolute value of the difference between the first distance and the second distance to the sum of the first distance and the second distance is larger than a predetermined value.

Preferably, the predetermined value is 0.1048.

In this embodiment, the circuit modules are COFs (Chip On Film) 101, the COFs 101 are connected, in series or in parallel, with a timing control circuit 102, respectively, and the connection mode is not limited in the present invention. In practical application, alternatively, the circuit modules may be COGs (Chip On Glass), the COGs 101 are connected, in series or in parallel, with the timing control circuit, respectively, and the connection mode is not limited in the present invention.

It should be noted that, other electronic components may exist between the COFs, and resistors or other electronic components may be provided on connection lines between the COFS or COGs and the timing control circuit. In order to simplify description, detailed descriptions thereof are not given in the present invention and are not shown in the accompanying drawings.

Figure 2:
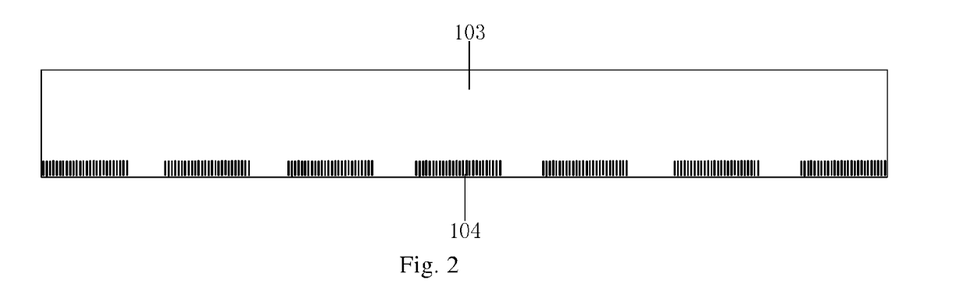
FIG. 2 is a schematic diagram of a structure of a first printed circuit board provided by the first embodiment of the present invention.
Figure 3:
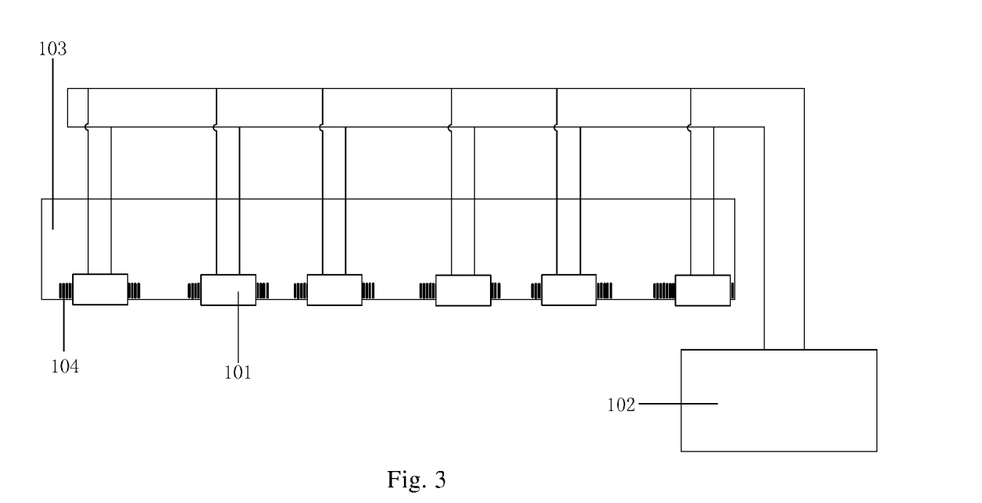
FIG. 3 is a schematic diagram of bonding the first printed circuit board with COFs in the first embodiment of the present invention.

FIG. 2 is a schematic diagram of a structure of a first printed circuit board provided by the first embodiment of the present invention, and FIG. 3 is a schematic diagram of bonding the first printed circuit board with the COFs in the first embodiment of the present invention. As shown in FIGS. 2 and 3, the circuit further includes a first printed circuit board 103, a plurality of bonding areas 104, which correspond to the COFs, respectively, are provided on the first printed circuit board 103, a plurality of first gold fingers are provided in each bonding area 104, and the COFs are connected to the first printed circuit board through the corresponding bonding areas 104.

The width of the bonding area 104 matches with that of the corresponding COF. Optionally, the width of the bonding area 104 may be slightly larger than, slightly smaller than or equal to that of the corresponding COF. In practical application, because a non-wiring area is provided on the COF, generally, the width of the bonding area 104 is slightly smaller than that of the corresponding COF or slightly smaller than the maximum width of the corresponding COF when the COF is bonded onto the first printed circuit board 103 through the corresponding bonding area 104. It should be noted that, in FIG. 3, in order to illustrate the bonding area 104, the width of the bonding area 104 is illustrated to be smaller than that of the corresponding COF, but the present invention is not limited thereto.

In addition, for at least one of the bonding areas 104, distances of the bonding area 104 from two bonding areas 104 adjacent thereto are a first bonding distance and a second bonding distance, respectively, the first bonding distance corresponds to the first distance, the second bonding distance corresponds to the second distance, the first bonding distance is K1 times as large as the first distance, and the second bonding distance is K2 times as large as the second distance, where both K1 and K2 are larger than 0.

Preferably, both K1 and K2 are slightly larger than 1, in other words, the first bonding distance is slightly larger than the first distance, and the second bonding distance is slightly larger than the second distance. K1 may be in the range of 1.01 to 1.10, and K2 may be in the range of 1.01 to 1.10. Therefore, the width of the bonding area 104 is slightly smaller than that of the corresponding COF.

Optionally, K1 is equal to K2. For example, both K1 and K2 are equal to 1.05.

In this embodiment, a plurality of second gold fingers (not shown in figures) are provided between adjacent bonding areas 104. The second gold fingers and the first gold fingers may be formed simultaneously, and may also be formed from the same material. In general, the second gold finger is disconnected from the first gold finger, in order to avoid a signal from being input from the second gold finger by mistake, and obvious mismatch gap between the COFs can be avoided after the COFs are bonded onto the first printed circuit board 103 through the corresponding bonding areas 104.

In addition, in the case where the width of the bonding area 104 is slightly smaller than that of the corresponding COF, after the COFs are bonded onto the first printed circuit board 103 through the corresponding bonding areas 104, orthogonal projection, on the first printed circuit board 103, of each second gold finger may overlap with those of the COFs adjacent to said second gold finger, so that each second gold finger forms a support under the end portions of the COFs adjacent thereto, and thus the end portions of the respective COFs are prevented from being damaged due to the mismatch gap.

Optionally, a distance between any two adjacent COFs is the first distance or the second distance, and the first distance and the second distance alternate with each other. In this way, every circuit module is not positioned at the middle position of the standing wave field between the two circuit modules adjacent thereto, which further reduces interference of standing waves to transmission signals, and further alleviates signal distortion and signal attenuation.

The principle of the present invention is as follows: distances of at least one circuit module from two circuit modules adjacent thereto satisfy the above specific condition, so that the at least one circuit module can be prevented from being positioned at the middle position of the standing wave field between the two circuit modules adjacent thereto, as a result, interference of the standing wave to transmission signals is reduced, and signal distortion and signal attenuation are alleviated.

The principle of the present invention is described in detail below.

Figure 4:
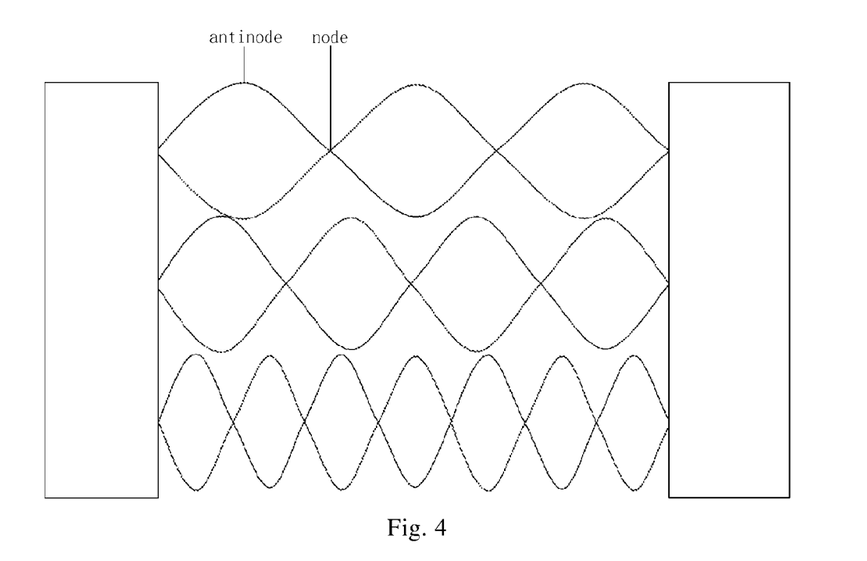
FIG. 4 is a schematic waveform diagram of standing waves generated in the first embodiment of the present invention.

FIG. 4 is a schematic waveform diagram of standing waves generated in the first embodiment of the present invention. As shown in FIG. 4, a standing wave has antinodes and nodes. The standing wave has the minimum amplitude at the nodes and has the maximum amplitude at the antinodes. Since the standing wave has the maximum amplitude at the antinodes, the strongest interference to transmission signals occurs at the antinodes. If the circuit module is provided near the antinode, severe signal interference will occur, and therefore, the best way to prevent a signal from being disturbed by a standing wave is to prevent the circuit module from being positioned close to the antinodes.

Referring to FIG. 4, when the length of a standing wave field is an integer multiple of the half wavelength of a standing wave, the standing wave is most obvious. When the length of the standing wave field is an odd multiple of the half wavelength of the standing wave, the antinode occurs at the middle position of the standing wave field. It can be seen that, the probability that the antinode occurs at the middle position of the standing wave field is very large, and thus, the circuit module should be prevented from being positioned at the middle position between a transmitter and a reflection source. In addition, during multiple reflections, a reflection source may become a transmitter, and therefore, in consideration of standing wave interference, both the case where a timing controller serves as a signal generating end and the case where a source driver serves as a signal generating end should be taken into account.

It is known from the above analysis that, a standing wave occurs when the length of the standing wave field is an integer multiple of the half wavelength of the standing wave, the amplitude of the standing wave at the wave node is zero, and the amplitude thereof at the antinode is twice as large as that of the original wave. Therefore, the wavelength of a transmission signal must not equal to an integer multiple of the half wavelength of the standing wave.

The length of a standing wave field is:

$$L = n \times \lambda/2, n=1, 2, 3, \quad (1)$$

The position of the antinode is:

$$x = (2k+1)\lambda/4, k=0, 1, 2, 3 \quad (2)$$

where, $\lambda$ is the wavelength of a standing wave.

It can be obtained after combining formula (1) with formula (2)

$$x = (2k+1)L/2n \quad (3)$$

It can be known that, when n is an odd number, x equals to L/2 and thus a position corresponding to L/2 is bound to be an antinode where the standing wave interference is the severest.

A currently mainstream FHD (Full High Definition) display device is taken as an example.

In the case where V-total=2100, H-total=1200, refresh rate is 120 HZ, and one-port output is set, a signal (thereinafter referred to as LVDS signal) output from a Mini-LVDS (Low Voltage Differential Signaling) interface for connecting the timing controller and a column driver has a frequency of 303 MHz, a wavelength of about 0.98 m, and a half wavelength of 0.48 m. A distance between adjacent COFs in the prior art is about 0.1 m, which cannot satisfy the condition that leads to occurrence of a standing wave. However, with the increase in both pixel density and frequency, the wavelength may be gradually shortened to a length comparable to the distance between the COFs, and thus a standing wave occurs.

Assuming that the distance between adjacent COFs is 0.1 m, when the wavelength is 0.2 m, the corresponding frequency is 1.5 GHZ, and thus the first standing wave occurs.

At this point, n=1, L=$\lambda$/2, the antinode occurs at the position X, which is equal to L/2. It can be known from the analysis that, standing wave interference will occur, moreover, first standing wave interference predominates, and the antinode occurs at the middle position between the reflection source and the transmitter.

Figure 5:
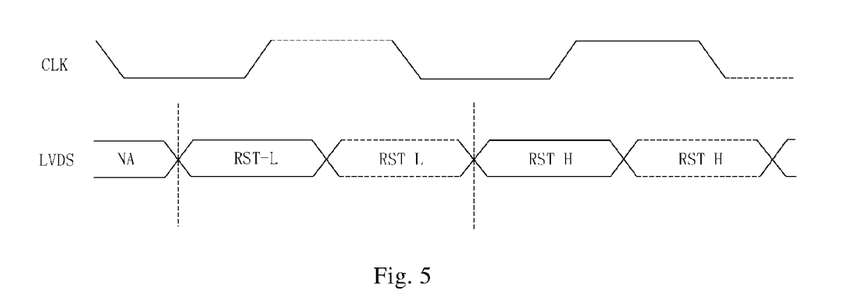
FIG. 5 is a waveform diagram of transmission signals in the first embodiment of the present invention.

FIG. 5 is a waveform diagram of transmission signals in the first embodiment of the present invention. As shown in FIG. 5, the LVDS signal triggers data read only on rising edges and falling edges of a CLK signal (i.e., clock signal). As for the LVDS signal, if it remains at a high level or a low level for a certain time, it can be identified as a high-level signal or a low-level signal. Considering that a signal can be identified as a high-level signal only when its voltage is higher than 90 percent of the maximum value of a digital voltage and is identified as a low-level signal only when its voltage is lower than 10 percent of the maximum value of the digital voltage, a signal whose voltage is between 10 to 90 percent of the maximum value of the digital voltage cannot be identified. Specifically, if the voltage of the LVDS signal is between 10 to 90 percent of the maximum value of the digital voltage when it triggers data read on the rising edges and falling edges of the CLK signal, at this point, the LVDS signal is considered to be lost. However, rising edges and falling edges always exist during signal transmission, rising edges and falling edges of a high-speed signal may take up a larger percentage of the entire period, and loss of signal may occur if a rising edge or falling edge of the CLK signal is aligned with that of the LVDS signal.

Typical values are preset as follows:

the distance between adjacent COFs is 0.1 m, the corresponding frequency is 1.5 GHZ when the wavelength is 0.2 m, the amplitude of the CLK signal is A, and the reflection coefficient is 0.3.

The following can be obtained based on the above preset values:

incident wave is represented as:

$$y = A \cos(wt - 2x\pi/\lambda) \quad (4)$$

reflected wave is represented as:

$$y' = A' \cos(wt + 2x\pi/\lambda) \quad (5)$$

it can be derived that $$y+y'=A \cos(wt-2x\pi/\lambda)+A' \cos(wt+2x\pi/\lambda)=(A-A')\cos(wt-2x\pi/\lambda)+2A' \cos(wt)\cos(2x\pi/\lambda) \quad (6)$$

It can be seen that, the resultant signal is a standing wave if A'=A, is a travelling wave if A'=0, and is a combination of standing wave and travelling wave if 0<A'<A. A normal travelling wave signal will be advanced or delayed to some extent as being disturbed by a standing wave, and data read is triggered when y+y'=0.

When x=0 (i.e., an antinode is positioned at the middle position of the standing wave field), the resultant signal is calculated as follow:

$$y+y'=(A-A')\cos(wt)+2A' \cos(wt)=(A+A')\cos(wt) \quad (7)$$

at this point, the amplitude at the middle position of the standing wave field is significantly increased, and the significantly increased noise will cause interference to signal transmission.

An antinode at any time and at any position is calculated as follow:

$$y+y'=(A-A')\cos(wt-2x\pi/\lambda)+2A' \cos(wt)\cos(2x\pi/\lambda) \quad (8)$$

In the above expression (8), the first term is a travelling wave term whose amplitude is independent of position, and the second term is a standing wave term whose amplitude is related to position and specifically is:

$$|2A' \cos(2x\pi/\lambda)| \quad (9)$$

The standard for determining a digital signal to be a high-level signal or a low-level signal is as follows: a signal with amplitude higher than 90 percent of the maximum amplitude is a high-level signal and a signal with amplitude lower than 10 percent of the maximum amplitude is a low-level signal. Therefore, in order to ensure that the signal is not disturbed, the following condition should be satisfied at least:

$$|2A' \cos(2x\pi/\lambda)|<10\% \times A, \text{ i.e., } |\cos(2x\pi/\lambda)|<5\% \times A/A' \quad (10)$$

If A/A'=0.3, the following is obtained:

$x/\lambda<-0.0262$ or $x/\lambda>0.0262$, and since the first standing wave should satisfy the condition that $\lambda=2L$, the following can be obtained:

$x<-0.0524$ L or $x>0.0524$ L. Thus, a COF cannot be provided at a position whose distance from the middle position of the standing wave field is within 0.0524 L.

Referring to FIG. 1, assuming that distances between any one COF and two COFs adjacent thereto are a first distance L1 and a second distance L2, respectively, and L1≠L2, if L1 and L2 satisfy a specific condition that:

$$|L1-L2|/2>0.0524\times(L1+L2),$$

every COF can be avoided from being positioned at the middle position of the standing wave field between the two COFs adjacent thereto in the circuit, and thus interference of standing wave to transmission signals is reduced, and signal distortion and signal attenuation are alleviated.

It should be noted that the values given to the parameters such as distance between COFs being 0.1 m, the corresponding frequency being 1.5 GHZ when the wavelength is 0.2, the amplitude of the CLK signal being A, the reflection coefficient being 0.3, and the like are merely exemplary, and the above parameters may be accordingly set by a person skilled in the art based on practical conditions and the above working principle.

In the circuit provided by this embodiment, distances of at least one circuit module from two circuit modules adjacent thereto satisfy the above specific condition, so that the at least one circuit module can be prevented from being positioned at the middle position of the standing wave field between the two circuit modules adjacent thereto, as a result, interference of standing wave to transmission signals is reduced, and signal distortion and signal attenuation are alleviated.

It should be noted that, the circuit may include a plurality of first printed circuit boards 103, wherein a plurality of bonding areas 104, which correspond to the COFs, respectively, are provided on each first printed circuit board 103, and a plurality of first gold fingers are provided in each bonding area 104.

Optionally, the distance between two COFs that are in adjacent first printed circuit boards respectively and are closest to each other is larger than the first distance or the second distance.

Second Embodiment

Figure 6:
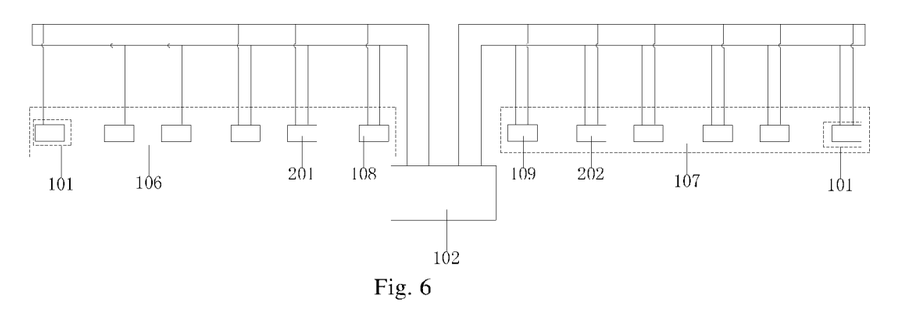
FIG. 6 is a schematic diagram of a structure of a circuit provided by a second embodiment of the present invention.

FIG. 6 is a schematic diagram of a structure of another circuit provided by a second embodiment of the present invention. As shown in FIG. 6, the circuit includes a plurality of circuit modules, which may be arranged in a line, and for at least one of the circuit modules, distances of the circuit module from two circuit modules adjacent thereto are a first distance and a second distance, respectively, the first distance is smaller than the second distance, and the absolute value of the difference between the second distance and the first distance is not equal to an integer multiple of the first distance.

Optionally, a ratio of the absolute value of the difference between the first distance and the second distance to the sum of the first distance and the second distance is larger than a predetermined value.

Preferably, the predetermined value is 0.1048.

In this embodiment, as shown in FIG. 6, the circuit modules are COFs 101, a part of the COFs 101 form a first COF set 106, the rest of the COFs 101 form a second COF set 107, and the first COF set 106 and the second COF set 107 are connected to the timing control circuit 102, respectively.

Alternatively, the circuit modules are COGs, a part of the COGs form a first COG set, the rest of the COGs form a second COG set, and the first COG set and the second COG set are connected to the timing control circuit, respectively (not shown in figures).

Figure 7:
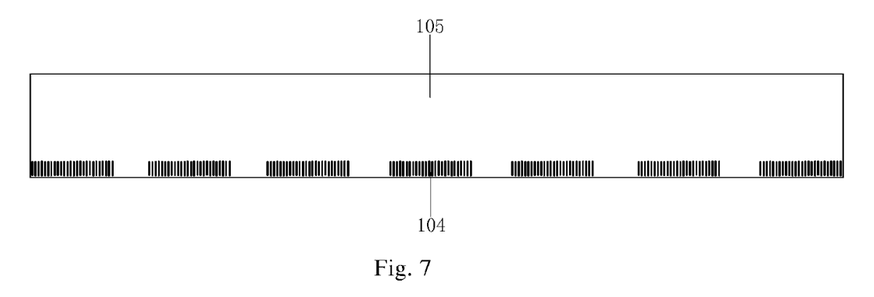
FIG. 7 is a schematic diagram of a structure of a second printed circuit board provided by the second embodiment of the present invention.
Figure 8:
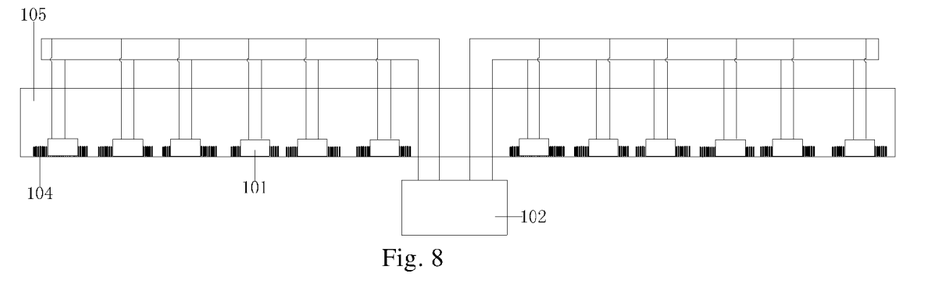
FIG. 8 is a schematic diagram of bonding the second printed circuit board with COFs in the second embodiment of the present invention.

FIG. 7 is a schematic diagram of a structure of a second printed circuit board provided by the second embodiment of the present invention; and FIG. 8 is a schematic diagram of bonding the second printed circuit board with COFs in the second embodiment of the present invention. As shown in FIGS. 7 and 8, the circuit further includes a second printed circuit board 105, on which a plurality of bonding areas 104 respectively corresponding to the COFs are provided, a plurality of first gold fingers are provided in each bonding area 104, and each COF is connected to the second printed circuit board through the corresponding bonding area 104.

Referring to FIGS. 6 and 8, the first COF set 106 and the second COF set 107 may be provided on the same second printed circuit board 105. Needless to say, the first COF set 106 and the second COF set 107 may be provided on two second printed circuit boards 105 electrically connected to each other, respectively. As shown in FIG. 8, in the case that the first COF set 106 and the second COF set 107 are provided on the same second printed circuit board 105, a first COF 108 in the first COF set 106 and a second COF 109 in the second COF set 107 are adjacent to each other; a third COF 201 and the first COF 108 in the first COF set 106 are adjacent to each other and the distance therebetween is the first distance or the second distance; a fourth COF 202 and the second COF 109 in the second COF set 107 are adjacent to each other and the distance therebetween is the first distance or the second distance. Here, the distance between the first COF 108 and the third COF 201 and the distance between the second COF 109 and the fourth COF 202 are the same or approximately the same.

Optionally, the distance between the first COF 108 in the first COF set 106 and the second COF 109 in the second COF set 107 is larger than the first distance or the second distance.

Preferably, a distance between any two adjacent COFs is the first distance or the second distance, and the first distance and the second distance alternate with each other. In this way, every circuit module is not positioned at the middle position of the standing wave field between two circuit modules adjacent thereto, which further reduce interference of standing waves to transmission signals, and further alleviate signal distortion and signal attenuation.

In practical application, because a non-wiring area is provided on the COF, generally, the width of the bonding area 104 is slightly smaller than that of the corresponding COF or slightly smaller than the maximum width of the corresponding COF when the COF is bonded onto the second printed circuit board 105 through the corresponding bonding area 104.

In addition, distances between the bonding area 104 and two bonding areas 104 adjacent thereto are a first bonding distance and a second bonding distance, respectively, the first bonding distance corresponds to the first distance, the second bonding distance corresponds to the second distance, the first bonding distance is K1 times as large as the first distance, and the second bonding distance is K2 times as large as the second distance, where both K1 and K2 are larger than 0.

Preferably, both K1 and K2 are slightly larger than 1, in other words, the first bonding distance is slightly larger than the first distance, and the second bonding distance is slightly larger than the second distance. K1 may be in the range of 1.01 to 1.10, and K2 may be in the range of 1.01 to 1.10. For example, both K1 and K2 are equal to 1.05. Accordingly, the width of the bonding area 104 is slightly smaller than that of the corresponding COF.

Needless to say, both K1 and K2 may be larger than 0 and smaller than or equal to 1.

In this embodiment, a plurality of second gold fingers (not shown in figures) are provided between adjacent bonding areas 104, the second gold fingers and the first gold fingers may be formed simultaneously, and may also be formed from the same material. In general, the second gold finger is disconnected from the first gold finger, in order to avoid a signal from being input from the second gold finger by mistake, and obvious mismatch gap between the COFs can be avoided after the COFs are bonded onto the second printed circuit board 105 through the corresponding bonding areas 104.

In addition, in the case where the width of the bonding area 104 is slightly smaller than that of the corresponding COF, after the COFs are bonded onto the second printed circuit board 105 through the corresponding bonding areas 104, orthogonal projection, on the second printed circuit board 105, of each second gold finger may overlap with those of the COFs adjacent to said second gold finger, so that each second gold finger forms a support under the end portions of the COFs adjacent thereto, and thus the end portion of each COF are prevented from being damaged due to the mismatch gap.

Other specific description of the circuit provided by the embodiment may refer to that in the first embodiment, and is not repeatedly given herein.

In the circuit provided by the embodiment, distances of at least one circuit module from two circuit modules adjacent thereto satisfy the above specific condition, so that the at least one circuit module can be prevented from being positioned at the middle position of the standing wave field between the two circuit modules adjacent thereto, as a result, interference of standing wave to transmission signals is reduced, and signal distortion and signal attenuation are alleviated.

Third Embodiment

This embodiment provides a display substrate including the circuit provided by the first embodiment or the second embodiment, and specific description thereof may refer to the above description in the first or second embodiment and is not repeatedly given herein.

The circuit included in the display substrate provided by the embodiment can prevent at least one circuit module therein from being positioned at the middle position of the standing wave field between two circuit modules adjacent thereto, as a result, interference of standing wave to transmission signals is reduced, and signal distortion and signal attenuation are alleviated.

Fourth Embodiment

This embodiment provides a display device including the display substrate provided by the third embodiment, and specific description thereof may refer to the above description in the third embodiment and is not repeatedly given herein.

The circuit included in the display device provided by the embodiment can prevent at least one circuit module therein from being positioned at the middle position of the standing wave field between two circuit modules adjacent thereto, as a result, interference of standing wave to transmission signals is reduced, and signal distortion and signal attenuation are alleviated.

It should be understood that, the above implementations are merely exemplary implementations used for explaining the principle of the present invention, but the present invention is not limited thereto. For those skilled in the art, various modifications and improvements may be made without departing from the spirit and essence of the present invention, and these modifications and improvements are also deemed as falling within the protection scope of the present invention.

The invention claimed is:

1. A circuit, comprising a plurality of circuit modules, wherein for at least one of the circuit modules, distances of the circuit module from two circuit modules adjacent thereto are a first distance and a second distance, respectively, the first distance is smaller than the second distance, and the absolute value of the difference between the second distance and the first distance is not equal to an integer multiple of the first distance.

2. The circuit according to claim 1, wherein a ratio of the absolute value of the difference between the first distance and the second distance to the sum of the first distance and the second distance is larger than a predetermined value.

3. The circuit according to claim 2, wherein the predetermined value is 0.1048.

4. The circuit according to claim 1, wherein, the circuit modules are COFs, and the COFs are connected to a timing control circuit.

5. The circuit according to claim 1, wherein, the circuit modules are COGs, and the COGs are connected to a timing control circuit.

6. The circuit according to claim 4, wherein the circuit further comprises a first printed circuit board, on which a plurality of bonding areas respectively corresponding to the COFs are provided, a plurality of first gold fingers are provided in each bonding area, and each COF is connected to the first printed circuit board through the corresponding bonding area.

7. The circuit according to claim 6, wherein a distance between any two adjacent circuit modules is the first distance or the second distance, and the first distance and the second distance alternate with each other.

8. The circuit according to claim 4, wherein, a part of the COFs form a first COF set, the rest of the COFs form a second COF set, and the first COF set and the second COF set are connected to the timing control circuit, respectively.

9. The circuit according to claim 5, wherein a part of the COGs form a first COG set, the rest of the COGs form a second COG set, and the first COG set and the second COG set are connected to the timing control circuit, respectively.

10. The circuit according to claim 8, wherein the circuit further comprises a second printed circuit board, on which a plurality of bonding areas respectively corresponding to the COFs are provided, a plurality of first gold fingers are provided in each bonding area, and each COF is connected to the second printed circuit board through the corresponding bonding area.

11. The circuit according to claim 10, wherein, a distance between any two adjacent COFs is the first distance or the second distance, and the first distance and the second distance alternate with each other.

12. The circuit according to claim 11, wherein the first COF set comprises a first COF and a third COF, the second COF set comprises a second COF and a fourth COF, the first and second COFs are adjacent to each other, the third and first COFs are adjacent to each other, the fourth and second COFs are adjacent to each other, and a distance between the first COF and the third COF is the same or approximately the same as that between the second COF and the fourth COF.

13. The circuit according to claim 6 wherein for at least one of the bonding areas, distances of the bonding area from two bonding areas adjacent thereto are a first bonding distance and a second bonding distance, respectively, the first bonding distance corresponds to the first distance, the second bonding distance corresponds to the second distance, the first bonding distance is K1 times as large as the first distance, and the second bonding distance is K2 times as large as the second distance, where both K1 and K2 are larger than 0.

14. The circuit according to claim 13, wherein K1 ranges from 1.01 to 1.10, and K2 ranges from 1.01 to 1.10.

15. The circuit according to claim 14, wherein K1 is equal to K2.

16. The circuit according to claim 15, wherein both K1 and K2 equal to 1.05.

17. The circuit according to claim 13, wherein a plurality of second gold fingers are provided between adjacent bonding areas.

18. A display substrate, comprising the circuit according to claim 1.

19. A display device, comprising the display substrate according to claim 18.

* * * * *